June 23, 1970 W. G. DILLEY 3,517,270

SINGLE-ENDED, PUSH-PULL TRANSISTOR AMPLIFIER WITH ZERO INPUT IMPEDANCE CIRCUITRY ARRANGEMENT

Filed March 21, 1968

INVENTOR.
WILLIAM G. DILLEY

BY

ATTORNEYS 3,517,270
Patented June 23, 1970

3,517,270

SINGLE-ENDED, PUSH-PULL TRANSISTOR AMPLIFIER WITH ZERO INPUT IMPEDANCE CIRCUITRY ARRANGEMENT

William G. Dilley, 4168 North 425 West, Ogden, Utah 84404

Continuation-in-part of application Ser. No. 437,497, Mar. 5, 1965. This application Mar. 21, 1968, Ser. No. 715,016
Int. Cl. H03f 3/68
U.S. Cl. 330—15 5 Claims

ABSTRACT OF THE DISCLOSURE

A wide band, low distortion, low noise, low phase shift, single-ended amplifier characterized by a multiplicity of inputs of independently variable gain capability, a common mixed input of zero impedance, and a constant level output, irrespective of the number or the gain of the individual mixed inputs.

RELATED APPLICATION

The present application constitutes a continuation-in-part of my copending allowed application Ser. No. 437,497, filed Mar. 5, 1965, entitled "Single-Ended, Push-Pull, Transistor Audio Amplifier," now U.S. Pat. No. 3,376,515 issued Apr. 2, 1968 with claims covering the basic circuit arrangements.

BACKGROUND OF THE INVENTION

Field

The present invention relates to solid-state, audio frequency amplifiers, and specifically to mixing and isolation applications in audio control systems for recording, broadcast, and sound reinforcing functions.

State of the art

Audio control systems, fundamentally, accept a number of signal inputs, and provide amplification, frequency shaping, and augmented reverberation for each, on an independent basis. These separate signals are then mixed, or combined to provide an output of the desired mixture of the above processes.

Any single input position normally consists of amplification, equalization (fs), level control, splitting of main and reverberation channels with separate level control for the reverberation channel, signal mixing, booster amplification and control of combined signal for final desired output level.

Since more than one final signal output channel is common practice, and input positions are normally selectable to the appropriate channel combining network, electronic signal isolation of the individual channels is a design requirement.

In order to provide this isolation, three amplifiers are required for each signal input position: one at the input and one each prior to the combining networks for the main and the echo channels. Signal dynamic range requirements VS practical amplifier power output restrictions, have precluded any lesser number of amplifiers per position, without an attendant compromise in channel cross-talk (lack of isolation), or input dynamic range.

SUMMARY OF THE INVENTION

The amplifier of the invention is a versatile, solid-state, single circuit intended specifically for recording, broadcast, and direct sound system applications. It performs the described functions of booster amplifiers and mixing or combining networks, while simultaneously providing signal isolation between the various signal inputs. In accordance with the invention, an amplifier with an input impedance of zero, offers no path between various inputs and thereby eliminates cross-talk. A resistor in series with each input provides a means for independent gain control, and circuit means for accomplishing a fixed, or constant level, output negates the requirement for compensating for normal output level changes as the number of inputs are increased or decreased. An exceptionally low noise output of the amplifier allows a low level input signal, thereby requiring only standard gain in the input amplifier so as to not to impair the system dynamic range.

The elimination of the requirement for two amplifiers per input position through employment of this described invention, is believed to represent a considerable advance in the state of the art. For example, a 24 input/one channel output system would require 23 less amplifiers (2 less/position, one additional/channel to replace boosters and mixing network). Thus, the invention accomplishes the elmination of cost, bulk, weight, and wiring associated with these amplifiers, while providing the equivalent, or improved, electronic performance.

In accomplishing the objectives and purposes of the invention, the general circuitry of my aforementioned copending application is utilized.

THE DRAWING

There is shown in the several figures of the accompanying drawing what is presently contemplated as the best mode of carrying out the invention.

DETAILED DESCRIPTION OF ILLUSTRATED EMBODIMENTS

Figure 1:
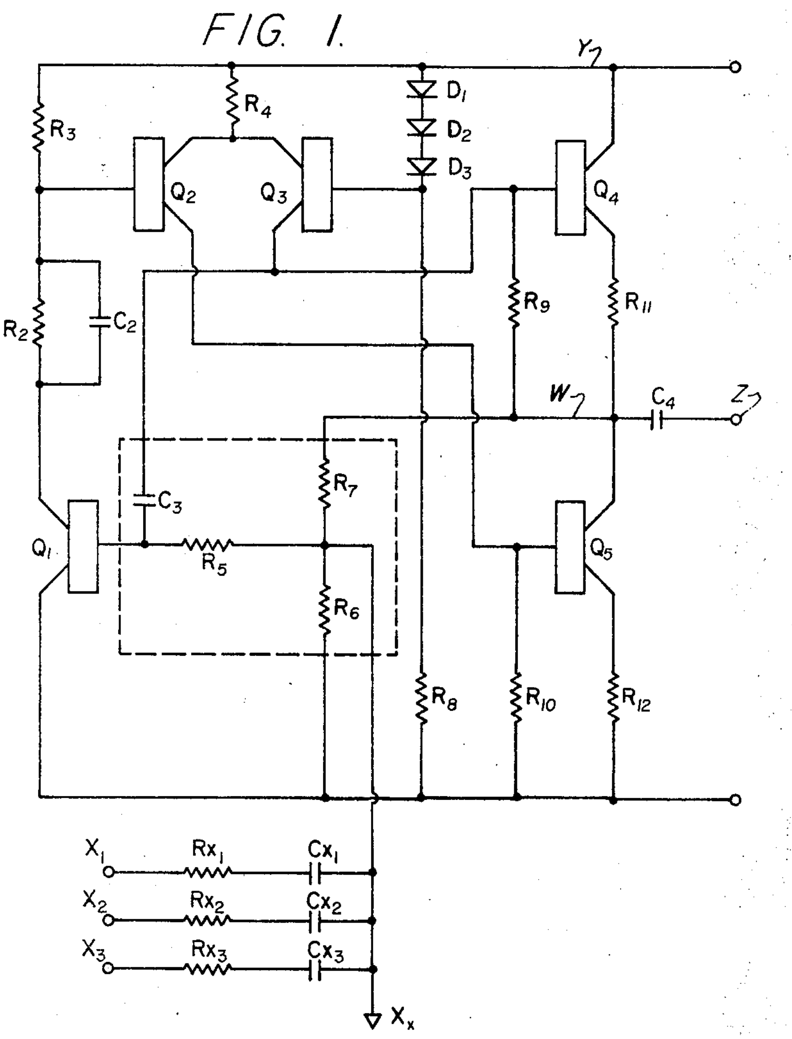
FIG. 1 is a circuit diagram showing a preferred form of the amplifier of the invention.

The amplifier shown in FIG. 1 is the basic amplifier of my previously referred-to copending application, Ser. No. 437,497, with modifications of the circuitry to provide a zero input impedance, a fixed output level, and variable gain that is a function of the source impedance. Rearrangement of the fundamental circuitry allows the amplifier to perform as a mixing amplifier without creating interaction between multiple inputs of differing levels.

As illustrated in FIG. 1, the input signal voltages are applied to terminals X. The current is limited by $R_x$, and $C_x$ is a DC blocking capacitor. The combined input is terminated at the junction of of $R_5$, $R_6$ and $R_7$ and is mixed with the amplifier output signal via $R_7$ and fed to the base of the input stage transistor $Q_1$ through resistor $R_5$. Transistor $Q_1$, here shown as of NPN type, amplifies the signal and feeds the second stage.

A resistance $R_2$ and a capacitor $C_2$, connected in parallel, are interposed in the line Y supplying voltage from power source B+ to the collector of the transistor, for dropping the voltage applied to such collector and thereby insuring low noise operation. The capacitor $C_2$ compensates for the collector capacity of the transistor $Q_1$. In order to adjust the current through transistor $Q_1$ and as a source impedance to $Q_2$, both of these to optimize noise, a resistor $R_3$ is interposed in the power-supplying line Y.

The circuitry comprises a second stage, which is a differential amplifier. It includes a differential pair of similar but not necessarily identical transistors $Q_2$ and $Q_3$.

In the illustrated arrangement, these transistors are PNP type. Diode means, here shown as three individual diodes $D_1$, $D_2$, and $D_3$ (in preference to a Zener diode for lower noise operation and lower cost), and a resistor $R_8$ are provided in circuit with the differential transistors $Q_2$ and $Q_3$ to form a voltage reference therefor.

This second stage forms a differential amplifier that allows symmetrical portions of the third or output stage to be driven identically but in mutual opposite phase. The signal from the first, or input, stage is fed to this differential amplifier of the second stage from transistor $Q_1$ through resistance $R_2$ and capacitor $C_2$.

The transistors $Q_2$ and $Q_3$ are connected to operate in common base mode, so that extended frequency response and low noise can be achieved, even though such transistors may be of low-cost type.

The output, or third stage of the amplifier is designed to provide completely symmetrical output with low distortion, and is, in effect, a push-pull stage. As illustrated, it includes symmetrical portions at respectively opposite sides of an output connection Z, such portions including a pair of similar transistors $Q_4$ and $Q_5$, respectively, operating in the common emitter mode, so that they can be of low cost silicon construction without jeopardizing the frequency response of the amplifier. In the illustrated embodiment, they are NPN type. For DC stabilization and equalization and, also, to provide a small amount of feed-back, resistor $R_{11}$ and $R_{12}$ are connected to the emitters of the respective transistors.

A capacitor $C_3$ is provided in circuit with the two transistors $Q_4$ and $Q_5$ to minimize any tendency toward instability or oscillation by limiting frequency response of this output stage, which also includes an output circuit W having a DC-blocking capacitor $C_4$ isolating the output load.

Bias on the output stage is determined by resistors $R_9$ and $R_{10}$, in the respective symmetrical output portions thereof, by a resistor $R_4$, and by the voltage on the base of transistor $Q_3$. Resistors $R_9$ and $R_{10}$ have resistance values low enough so that, together with the differential pair of transistor $Q_2$ and $Q_3$, they form identical voltage drivers for the output stage.

A unique network (enclosed by broken lines) contains both signal input and feedback circuitry. Resistors $R_6$ and $R_7$ provide both AC and DC feedback, and biasing for the input stage. This circuitry arrangement DC couples the amplifier internally, thereby negating any phase shift or roll-off at low frequencies. $C_3$ in combination with $R_5$ provides a high frequency feedback path from the output to the input for high frequency stabilization. This circuit arrangement is unique in that the feedback signal is derived ahead of the output so that capacitive output loads do not shunt the feedback to ground, and is isolated (at the input termination) from the input source by resistor $R_5$, so that input capacitive loads also do not shunt the feedback to ground. This arrangement provides an increased high frequency stability with respect to amplifier input and output capacitive loading.

Although the specific network shown is a superior one, the same results could be approached in a variety of ways well known to those skilled in the art.

Figure 2:
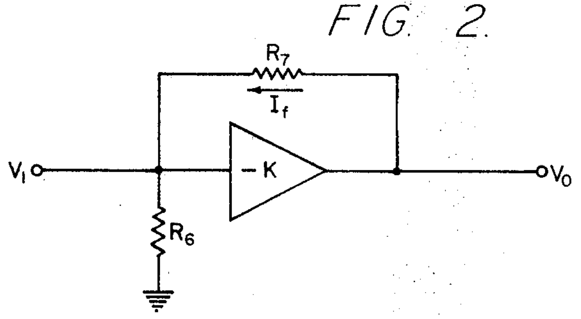
FIG. 2 is an equivalent circuit for the purpose of describing the isolation performance of the circuitry of FIG. 1.

The net effect of this circuit arrangement with respect to the input signal is an input impedance of zero, and can be derived utilizing the equivalent circuit diagram of FIG. 2.

The ampilfier open loop gain $= -K = \frac{V_0}{V_1}$ $$I_f = \frac{V_0 - V_1}{R_7} \quad \text{(Equation 1)}$$

Substituting $-K = \frac{V_0}{V_1}$ in Equation 1

$$I_f = \frac{-(1+K)V_1}{R_7} \quad \text{(Equation 2)}$$

$$V_1 = (I_1 + I_f)R_6 \quad \text{(Equation 3)}$$

Substituting Equation 2 into Equation 3

$$\frac{V_1}{I_1} = \frac{R_6 R_7}{R_6 + [R_7(1+K)]} \quad \text{(Equation 4)}$$

Since the input impedance is defined as:

$$Z_1 = \frac{V_1}{I_1} \quad \text{(Equation 5)}$$

Equation 4 becomes:

$$Z_1 = \frac{R_6 R_7}{R_1 + [R_7(1+K)]} \quad \text{(Equation 6)}$$

The only assumption made in this derivation is that the input current to the amplifier is negligible compared to the feedback current and the input current. The output current is, in practice, in excess of 10,000 times (extent of measurement capability) that of the feedback and input currents, so the assumption is valid for the purpose intended.

Since K is the open loop gain of the amplifier it can be seen that as K approaches infinity, the input impedance must approach zero.

The open loop gain of the amplifier is not infinite, so the amplifier does have some academic, but finite, input impedance. When practical values are substituted into Equation 6, we obtain a calculated impedance of less than 1/100 ohm, and since $R_x$ is on the order of 1000 ohms, the resulting isolation is greater than 100,000 to 1. The measured isolation of one of these amplifiers is greater than 141,400:1, the difference in the figures primarily resulting from the difficulty in measuring the K of the amplifier. The zero input impedance also provides the capability to change $R_x$ without affecting the other inputs or the outputs resulting from these inputs. It also allows inputs to be added and subtracted without affecting any existing inputs or the respective resulting outputs.

Figure 3:
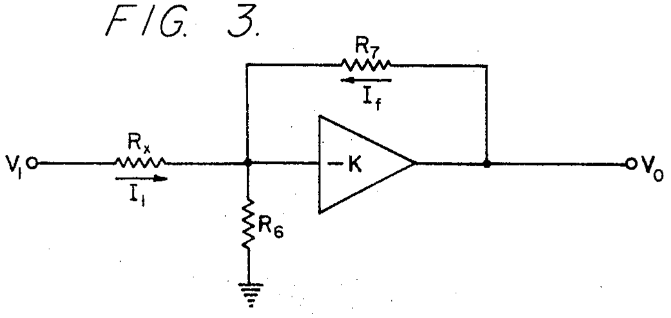
FIG. 3 is an equivalent circuit for the purpose of describing the individual input gain performance of the circuitry of FIG. 1.

The gain of the amplifier can be derived utilizing the equivalent circuit of FIG. 3.

Since the input impedance, $Z_1$, is zero, the input current is:

$$I_1 = \frac{V_1}{R_x} \quad \text{(Equation 7)}$$

If the input impedance is zero, the input voltage must be:

$$Z_1 = \frac{V_1}{I_1} = 0 \quad \text{(Equation 8)}$$

In order to satisfy the above, the feedback current, $I_f$, and the input current $I_1$ must be equivalent, but opposite.

$$I_f = I_1 \quad \text{(Equation 9)}$$

also:

$$I_f = \frac{V_0 - V_1}{R_7} \quad \text{(Equation 10)}$$

Since $V_1 = 0$ Equation 10 becomes:

$$I_f = \frac{V_0}{R_7} \quad \text{(Equation 11)}$$

Substituting Equation 11 into Equation 9:

$$I_f = \frac{-V_0}{R_7} \quad \text{(Equation 12)}$$

Substituting Equation 12 into Equation 7:

$$I_1=\frac{-V_0}{R_7}=\frac{V_1}{R_x}$$

$$\frac{V_0}{V_1}=-\frac{R_7}{R_x} \qquad \text{(Equation 13)}$$

Since the gain is defined as the output voltage divided by the input voltage, Equation 13 becomes:

$$G_v=-\frac{R_7}{R_x} \qquad \text{(Equation 14)}$$

Therefore, the gain is determined solely by the feedback resistor $R_7$, which is fixed, and by the external series resistor in each input $R_x$. The gain is not dependent on the number or value of the other inputs ($R_x$).

It is to be understood that, for use with a negative power supply, the designated PNP and NPN transistors will be reversed. It is also understood that for use as a balanced circuit, the invention may be duplicated, with identical amplifiers located about a common ground.

Whereas there is here specifically illustrated and described a preferred form of amplifier circuitry which is presently regarded as the best mode of carrying out the invention, it should be understood that various changes may be made without departing from the inventive subject matter particularly pointed out and claimed herebelow.

I claim:

1. A wide band, low distortion, low noise, low phase shaft, single-ended amplifier having a multiplicity of inputs of independently variable gain capability with a common mixed input of zero impedance, said amplifier providing a constant level output irrespective of the number or the gain of the individual mixed inputs and further comprising:
- an input stage including
  - input means for connection with said common mixed input;
  - an input transistor operating in the common emitter mode;
  - feedback blocking capacitance means connected between said input means and the base of said transistor for isolating input from feedback;
  - a line for connecting a power source to the collector of said transistor;
  - means in said line for dropping the voltage applied to said transistor to achieve low noise operation;
- a second stage including a differential amplifier having
  - a differential pair of mutually similar transistors, each operating in the common base mode, and diode means and a resistor in circuit with the emitter-base circuit of said pair of transistors to form a voltage reference therefor;
- an output stage including
  - a pair of output transistors operating in the common emitter mode;
  - resistors in the base circuit of said output transistors to effect equal DC bias and AC voltage drive;
  - resistors in the emitter circuit of said output transistors to effect DC stabilization, equalization, and some feedback;
  - an output circuit having a DC-blocking capacitor isolating the output load; and
- a network
  - connected between said output circuit and the base of said input transistor so as to perform the functions of AC feedback and DC bias, said network including a capacitor providing a connection with the collector circuit of said pair of transistors of the second stage, so as to perform high frequency response adjustment.

2. The combination recited in claim 1, additionally including a multiplicity of signal inputs of independently variable gain capability having a common mixed signal input of zero impedance; DC blocking capacitors in series circuit with said common input and the input transistor for feeding the input signals thereto; and resistors interposed between the respective DC blocking capacitors and said multiplicity of signal inputs for determining gain of said signal inputs.

3. An amplifier as recited in claim 1, wherein the network includes a pair of resistors forming a divider for both AC and DC feedback, and providing DC bias for the input stage, the voltage division point also being the signal input feed point; a high frequency compensation capacitor terminating at the base of said input transistor and having its feedback source ahead of the amplifier output so as to improve the high frequency stability of the amplifier when capacitive loading occurs at amplifier input and/or output; and a resistor interposed between the signal input point and the base feed of the input transistor and providing feedback blocking for said high frequency compensation capacitor.

4. A wide band, low distortion, low noise, low phase shaft, single-ended amplifier adapted for a multiplicity of inputs of independently variable gain capability having a common mixed input of zero impedance, said amplifier providing a constant level output irrespective of the number or the gain of the individual mixed inputs and comprising:
- an input stage;
- at least one intermediate stage;
- an output stage;
- a network connected between said output stage and said input stage and including
  - resistors connected between output and ground to form a divider for both AC and DC feedback and the DC bias for said input stage and providing a voltage division point; and input means for connection with said common mixed input, said input means being connected to the said voltage division point so as to obtain an amplifier input impedance of zero.

5. The combination recited in claim 4, additionally including a multiplicity of signal inputs of independently variable gain capability having a common mixed signal input of zero impedance; DC blocking capacitors in series circuit with said common input for feeding the input signals thereto; and resistors interposed between the respective DC blocking capacitors and the respective signal inputs for determining gain of said signal inputs.

References Cited

UNITED STATES PATENTS 3,376,515 4/1969 Dilley.

FOREIGN PATENTS 548,760 11/1959 Belgium.

ROY LAKE, Primary Examiner

L. J. DAHL, Assistant Examiner

U.S. Cl. X.R.

330—30, 147